United States Patent
Meyrueis et al.

(10) Patent No.: US 7,048,190 B2
(45) Date of Patent: May 23, 2006

(54) METHOD AND APPARATUS FOR RECORDING TO AND READING FROM A DIFFRACTIVE OPTICS MEMORY USING SYMMETRICAL ANGULAR ENCODING

(75) Inventors: Patrick Meyrueis, Strasbourg (FR);
Idriss El Hafidi, Strasbourg (FR);
Romualda Grzymala, Strasbourg (FR);
Joël Fontaine, Strasbourg (FR)

(73) Assignee: Research Investment Network, Inc., Irvine, CA (US)

( * ) Notice: Subject to any disclaimer, the term of this patent is extended or adjusted under 35 U.S.C. 154(b) by 0 days.

(21) Appl. No.: 10/506,941

(22) PCT Filed: Mar. 21, 2002

(86) PCT No.: PCT/EP02/03239

§ 371 (c)(1),
(2), (4) Date: Apr. 18, 2005

(87) PCT Pub. No.: WO2004/081160

PCT Pub. Date: Sep. 23, 2004

(65) Prior Publication Data

US 2005/0230476 A1   Oct. 20, 2005

(51) Int. Cl.
*G06K 7/10* (2006.01)
(52) U.S. Cl. .................. 235/454; 235/462.25
(58) Field of Classification Search ........ 235/454, 235/455, 375, 493, 494; 359/676, 226, 22, 359/3, 15, 25
See application file for complete search history.

(56) References Cited

U.S. PATENT DOCUMENTS

| | | | |
|---|---|---|---|
| 3,544,200 A * | 12/1970 | Boll | 359/226 |
| 5,696,613 A * | 12/1997 | Redfield et al. | 359/32 |
| 6,293,898 B1 * | 9/2001 | Yang | 359/22 |
| 6,580,777 B1 * | 6/2003 | Ueki et al. | 378/17 |
| 2004/0051878 A1 * | 3/2004 | Rhoads | 356/521 |
| 2004/0179251 A1 * | 9/2004 | Anderson et al. | 359/3 |
| 2004/0190154 A1 * | 9/2004 | Wakai et al. | 359/676 |
| 2005/0137786 A1 * | 6/2005 | Breed et al. | 701/200 |
| 2005/0168856 A1 * | 8/2005 | El Hafidi et al. | 359/883 |
| 2005/0169094 A1 * | 8/2005 | Itoh et al. | 365/232 |

* cited by examiner

*Primary Examiner*—Thien M. Le
(74) *Attorney, Agent, or Firm*—Steve A. Wong; Caroline T. Do

(57) ABSTRACT

The present invention relates to an apparatus and method for reading information from and recording information to a diffractive optics memory using symmetrical angular encoding. A coherent light source is split to form an object beam and a corresponding reference beam. An optical axis is defined by the object beam being aligned perpendicular to a plane of the diffractive optics memory. A steering mirror is configured to direct the reference beam received from the coherent light source to the memory. A first plurality of mirrors arranged around one side of the optical axis receives the reference beam from the steering mirror and directs the reference beam at a first angle towards the memory. A second plurality of mirrors arranged around the symmetrical side of the optical axis receives the reference beam from the steering mirror and directs the reference beam at a second angle towards the memory. The first angle is identical to the second angle but formed on the symmetrical side of the optical axis.

20 Claims, 2 Drawing Sheets

METHOD AND APPARATUS FOR RECORDING TO AND READING FROM A DIFFRACTIVE OPTICS MEMORY USING SYMMETRICAL ANGULAR ENCODING

CROSS-REFERENCE TO RELATED APPLICATIONS

This application relates to the applications entitled: PHOTONICS DATA STORAGE SYSTEM USING A POLYPEPTIDE MATERIAL AND METHOD FOR MAKING SAME (PCT/FR01/02386) filed on Jul. 20, 2001.

FIELD OF INVENTION

The present invention generally relates to a large volume diffractive optics memory. In particular, the present invention relates to an apparatus and method for recording information to and reading information from a diffractive optics memory.

BACKGROUND OF THE INVENTION

The large storage capacities and relative low costs of CD-ROMS and DVDs have created an even greater demand for still larger and cheaper optical storage media. Holographic memories have been proposed to supersede the optical disc as a high-capacity digital storage medium. The high density and speed of the holographic memory comes from three-dimensional recording and from the simultaneous readout of an entire packet of data at one time. The principal advantages of holographic memory are a higher information density ($10^{11}$ bits or more per square centimeter), a short random access time (~100 microseconds and less), and a high information transmission rate ($10^9$ bit/sec).

In holographic recording, a light beam from a coherent monochromatic or multispectral source (e.g., a laser) is split into a reference beam and an object beam. The object beam is passed through a spatial light modulator (SLM) and then into a storage medium. The SLM forms a matrix of shutters (in the binary case) or, more generally, a matrix of photocells modulating the light intensity that represents a packet of data. The object beam passes through the SLM which acts to modulate the object beam with the binary information being displayed on the SLM. The modulated object beam is then directed to one point on the storage medium by a beam processor where it intersects with the reference beam to create a hologram representing the packet of data.

An optical system consisting of lenses and mirrors is used to precisely direct the optical beam encoded with the packet of data to the particular spatially addressed area of the storage medium. Optimum use of the capacity of a thick storage medium is realized by spatial and angular multiplexing. In spatial multiplexing, a set of packets is stored in the storage medium shaped into a plane as an array of spatially separated and regularly arranged sub-holograms by varying the beam target in the x-axis and y-axis of the plane. Each sub-hologram is formed at a point in the storage medium with the rectangular coordinates representing the respective packet address as recorded in the storage medium. In angular multiplexing, recording is carried out by keeping the x- and y-coordinates the same while changing the irradiation angle of the reference beam in the storage medium. By repeatedly incrementing the irradiation angle, a plurality of packets of information is recorded as a set of sub-holograms at the same x- and y-spatial location.

Previous techniques for recording information in a highly multiplexed volume holographic memory and for reading the information out of the holographic memory are limited in memory capacity.

It is therefore an object of the present invention to provide an apparatus for recording information to a memory capable of an extended storage capacity.

It is also an object of the present invention to provide an apparatus for reading a memory capable of an extended storage capacity.

It is a further object of the present invention to double the capacity of the memory storage.

Further objects and advantages of the present invention will become apparent from a consideration of the drawings and ensuing description.

SUMMARY OF THE INVENTION

In order to achieve the above-mentioned objectives, the present invention comprises a diffractive storage system for recording information on a diffractive optics memory. A coherent light source is split to form an object beam and a corresponding reference beam. An optical axis is defined by the object beam being aligned perpendicular to a plane of the diffractive optics memory. A steering mirror is configured to direct the reference beam received from the coherent light source to the memory. A first plurality of mirrors arranged around one side of the optical axis receives the reference beam from the steering mirror and directs the reference beam at a first angle of a plurality of first angles towards the memory. A second plurality of mirrors arranged around the symmetrical side of the optical axis receives the reference beam from the steering mirror and directs the reference beam at a second angle of a plurality of second angles towards the memory. The first angle is identical to the second angle but formed on the symmetrical side of the optical axis.

In a further aspect of the present invention, the steering mirror is a rotating mirror.

In yet another aspect of the present invention, the steering mirror is a Micro Opto Electro Mechanical System.

A further aspect of the present invention comprises the memory having a plurality of points storing information therein. The object beam and the reference beam interfere at the first angle to form a first sub-hologram at one of the points of the memory and the reference beam interferes with the object beam at the second angle to form a second sub-hologram at the point.

In another aspect of the present invention, the steering mirror is located on the optical axis which directs the reference beam to one of the mirrors.

In still another aspect of the present invention, the memory is made of a polypeptide material.

In yet another aspect of the present invention, the present invention comprises a diffractive storage system for reading information from a diffractive memory. A coherent light source forms a reference beam. An optical axis is defined by the reference beam being aligned perpendicular to a plane of the memory. A steering mirror is configured to direct the reference beam received from the coherent light source to the memory. A first plurality of mirrors arranged around one side of the optical axis receives the reference beam from the steering mirror and directs the reference beam at a first angle of a plurality of first angles towards one of the points of the memory. A second plurality of mirrors arranged around the symmetrical side of the optical axis receives the reference beam from the steering mirror and directs the reference beam at a second angle of a plurality of second angles towards the one of the points of the memory. The first angle is the same value as the second angle but formed on the symmetrical side of the optical axis.

In yet another aspect of the present invention, an array of light sensitive elements is configured to detect a reconstruction of a first packet of information at the point of the memory illuminated with the reference beam and to detect a reconstruction of a second packet of information at the point of the memory illuminated with the reference beam In still another aspect of the present invention, the optical axis is defined perpendicular to a plane of the memory by the object beam.

In a further aspect of the present invention, the first angle is identical in value to the second angle but formed on the symmetrical side of the optical axis.

In yet another aspect of the present invention, a steering mirror directs the reference beam to any of the first and second plurality of mirrors.

In still another aspect of the present invention, the steering mirror is a Micro Opto Electro Mechanical System.

In a further aspect of the present invention, the steering mirror is located on the optical axis directing the reference beam to one of the plurality of mirrors.

In still another aspect, the present invention comprises the memory wherein the object beam and the reference beam interferes at the first angle to form a sub-hologram at a point of the storage memory and the reference beam interferes with the object beam at the second angle to form a second sub-hologram at the point.

In another aspect of the present invention, the memory is made of a polypeptide material.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

Recording Apparatus

Figure 1:
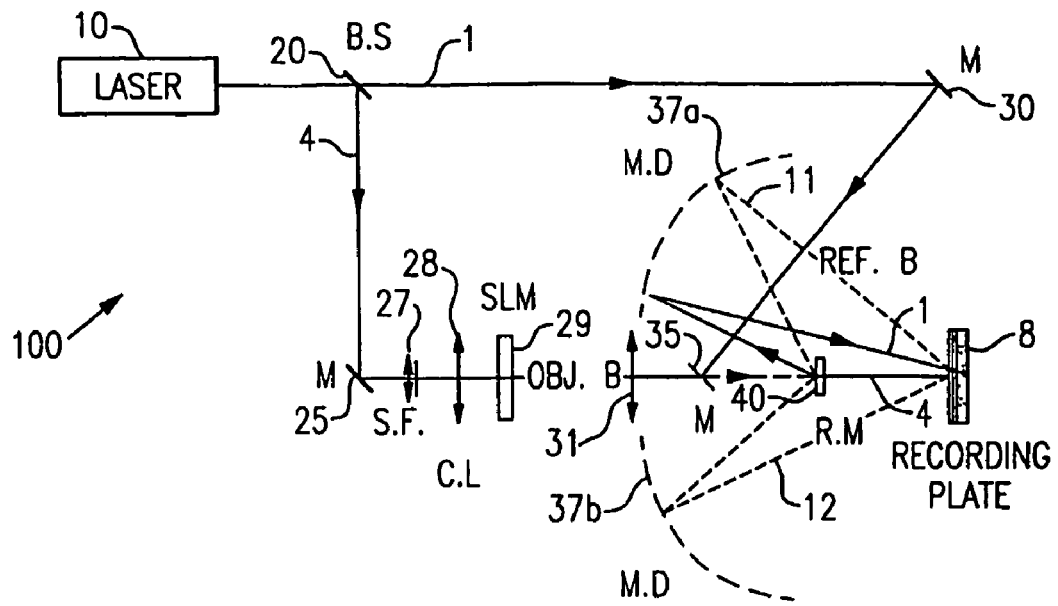
FIG. 1 shows an apparatus for recording information on a diffractive optics memory according to the present invention.

FIG. 1 shows an apparatus 100 for recording information on a diffractive optics memory 8 according to the present invention. A laser 10 emits a coherent light beam which is divided by a beam splitter 20 into a reference beam 1 and an object beam 4. The object beam 4 is directed by mirror 25 to the diffractive optics memory 8. The diffractive optics memory 8 comprises a recording plate coated with a layer of polypeptide. After the object beam 4 reflects off of the mirror 25, the object beam 4 is processed by a spatial filter (S.F.) 27 and a collimating lens (C.L.) 28 so that it transmits through display 29 where it is modulated with a packet of information 6 (see FIG. 2) an focused by focussing lens 31 onto the recording plate 8. The mirrors 35, 40 are located in different planes from the object beam 4 so as not to obstruct the object beam 4. The spatial filter 27 removes unwanted noise from the laser beam through a simple diffractive phenomena. Generally, the spatial filter 27 is composed of a short focal lens with a pinhole located in its focussing plane. The laser light out of this hole is cleaned (smoothed) from all the beam defects so that the spatial light modulator (SLM) 29 will be illuminated with a uniform laser light. The collimating lens 28 (symbolized by a double arrow) collimates the laser beam coming from the spatial filter 27 to transform a divergent shaped beam to a collimated beam so that it reaches a uniform intensity on the display 29, that is, in a way that the light reaching any cell of the display 29 will be equal.

The display 29 may be any display for displaying a data packet 6 in two dimensions such as a spatial light modulator (SLM) or a liquid crystal light valve (LCLV). The display 29 comprises, for example, a liquid crystal display screen on which data is encoded in a two-dimensional pattern of transparent and opaque pixels. The data is input to the display 29 via a computer (not shown) or by other digital data or analog origins. The plurality of bits represented on the display screen of the display 29, a two-dimensional pattern of transparent and opaque pixels, is known as a data packet 6 (see FIG. 2). The data packed 6 displayed is derived from any source such as a computer program, the Internet, or any other data source. In an Internet storage application, the packets displayed may be formatted similarly to the packets of the Internet. The object beam 4 is modulated by the information to be recorded by means of transmission through the display 29.

At the same time, the reference beam 1 undergoes various reflections off the set of mirrors 30, 35, 40 at least one of which can rotate so that the reference beam 1 arrives at a plurality of micro-mirrors 37a, 37b which are distributed along a circular arc and the orientation of which will modify the angle of incidence of the reference beam 1 with respect to the object beam 4, again in the region of the diffractive optics memory 8. Thus, by this process, angular multiplexing is implemented. The recording apparatus 100 implements symmetrical addressing by angular multiplexing on both sides of the optical axis of the object beam 4. The optical axis is formed by that segment of the object light beam 4 positioned between mirror 25 and the diffractive optics memory 8 so that it is perpendicular to a plane of the diffractive optics memory 8. The first plurality of mirrors 37a arranged around one side of the optical axis receives the reference beam 1 from the steering mirror 40 and one of the first plurality of mirrors 37a then directs the reference beam at a first angle of a plurality of first angles towards the memory 8. The second plurality of mirrors 37b arranged around the symmetrical side of the optical axis receives the reference beam 1 from the steering mirror 40 and one of these mirrors then directs the reference beam 1 at a second angle of a plurality of second angles towards the memory 8. The first angle is identical to the second angle but formed on the symmetrical side of the optical axis.

The diffractive optics memory 8 comprises a recording plate having coated thereon a polypeptide photosensitive material. As illustrated in FIG. 1, reference light beam 11 and reference light beam 12 are formed to intersect the optical axis at a point of the diffractive optics memory 8 at an identical angle but on opposite sides of the optical axis. The optical axis is formed by the object beam 4 as shown in FIG. 1 and described above. There is formed a diffracted optical image 8a (see FIG. 2), or more precisely a structure resulting from the interference of the object beam 4 with the reference beam 1, which is stored in the storage material 8. Spatial multiplexing is carried out by mechanically shifting the material 8 so that a data packet is recorded at a different point of the material 8.

Figure 2:
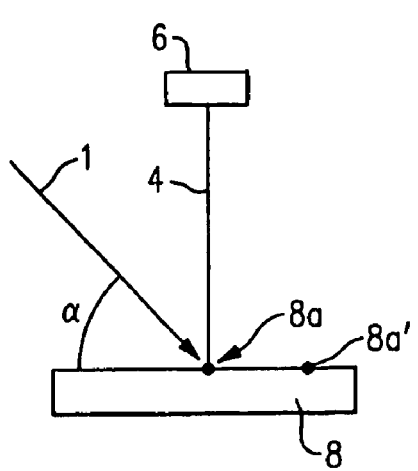
FIG. 2 shows the process of diffractive recording by interference of an object beam and a reference beam.

FIG. 2 shows a schematic of the important signals involved in recording a diffraction pattern, that can be named alternately a hologram, in a the diffractive optics memory 8 using angular and spatial multiplexing. Various diffractive recording processes have been developed in the art and further details can be found in the book *Holographic Data Storage, Springer* (2000) edited by H. J. Coufal, D. Psaltis, and G. T. Sincerbox. In forming a hologram, the reference beam 1 intersects with the object beam 4 to form a sub-hologram 8a (referred to alternately as a point) extending through the volume of the memory 8. There is a separate sub-hologram or point 8a extending through the volume for each angle and spatial location of the reference beam 1. The object beam 4 is modulated with a packet of information 6. The packet 6 contains information in the form of a plurality of bits. The source of the information for the packet 6 can be a computer, the Internet, or any other information-producing source. The hologram impinges on the surface 8a of the storage medium 8 and extends through the volume of the storage medium 8. The information for the packet 6 is modulated onto the storage medium 8 by spatial multiplexing and angle multiplexing. Angle multiplexing is achieved by varying the angle a of the reference beam 1 with respect to the surface plane of the storage medium 8. A separate packet 6 of information is recorded in the storage medium 8 as a sub-hologram for each chosen angle a and spatial location. Spatial multiplexing is achieved by shifting the reference beam 1 and the object beam 4 with respect to the surface of the storage medium 8 (achieved by translating the recording plate) so that the point 8a shifts to another spatial location, for example point 8a', on the surface of the storage medium 8.

The storage medium 8 is typically a three-dimensional body made up of a material sensitive to a spatial distribution of light energy produced by interference of the object light beam 4 and the reference light beam 1. A hologram may be recorded in a medium as a variation of absorption or phase or both. The storage material must respond to incident light patterns causing a change in its optical properties. In a volume hologram, a large number of packets of data can be superimposed as diffraction patterns, so that every packet of data can be reconstructed without distortion. A volume (thick) hologram may be regarded as a superposition of three dimensional gratings recorded in the depth of the emulsion each satisfying the Bragg law (i.e., a volume phase grating). The grating planes in a volume hologram produce change in refraction and/or absorption.

Several materials have been considered as storage material for optical storage systems because of inherent advantages. These advantages include a self-developing capability, dry processing, good stability, thick emulsion, high sensitivity, and nonvolatile storage. Some materials that have been considered for volume holograms are photofractive crystals, photopolymer materials, and polypeptide material.

The diffractive optics memory 8 may be made of photopolymer materials, polypeptide material, and other such materials for optical recording. With a photopolymer the density storage will be much more limited than by using a polypeptide with a shorter life duration and a lower SNR and a lower tolerancing. Thus, preferably, the diffractive optics memory 8 is made of a polypeptide material. An embodiment of a polypeptide material suitable for the storage medium 8 is disclosed in the application PHOTONICS DATA STORAGE SYSTEM USING A POLYPEPTIDE MATERIAL AND METHOD FOR MAKING SAME (PCT/FR01/02386) filed on Jul. 20, 2001 and incorporated herein.

Figure 3:
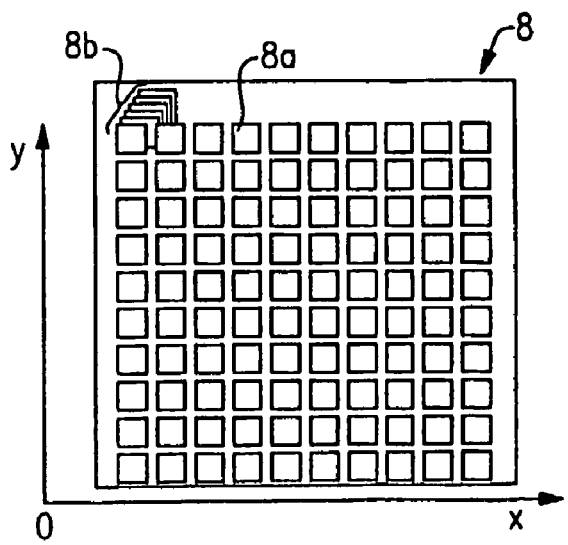
FIG. 3 is a schematic representation of a matrix of points formed in a diffractive optics memory

FIG. 3 shows in greater detail the diffractive optics memory (i.e., storage medium) 8 arranged in the form of a flat sheet, herein referred to as a matrix. In this example, the matrix is 1 cm$^2$. Each of a plurality of points on the matrix is defined by its rectilinear coordinates (x, y). An image-forming system (not shown) reduces the object beam 4 to the sub-hologram 8a having a minimum size at one of the x, y points of the matrix. A point in physical space defined by its rectilinear coordinates contains a plurality of packets 8b.

In this embodiment, a 1 mm$^2$ image 8a is obtained by focusing the object beam 4 onto the storage medium 8 centered at its coordinate. Due to this interference between the two beams 1,4, a diffractive pattern 8a 1 mm$^2$ in size is recorded in the storage material 8 centered at the coordinates of the matrix. Spatial multiplexing is carried out by sequentially changing the rectilinear coordinates. The object beam 4 focuses on the storage material 8 so that a separate pattern 8a is recorded at a unique position in the plane defined by its coordinates (x, y). This spatial multiplexing results in a 10 by 10 matrix of diffractive images 8a. Angle multiplexing is carried out by sequentially changing the angle of the reference beam 1 by means of the mirrors 37a, 37b as described above. Angle multiplexing is used to create 15–20 packets of information 8b corresponding to 15 discrete variations of the angle of incidence of the reference beam. Experimental results show that 25 multiplexing angles are possible and this can be doubled, by the symmetric set-up of the present invention to 50 angles. A data packet is reconstructed by shinning the reference beam 1 at the same angle and spatial location in which the data packed was recorded. The diffractive portion of the reference beam 1 diffracted by the storage material 8 forms the reconstruction, which is typically detected by a detector array. The storage material 8 may be mechanically shifted in order to store data packets at different points by its coordinates (x, y).

Reading Apparatus

Figure 4:
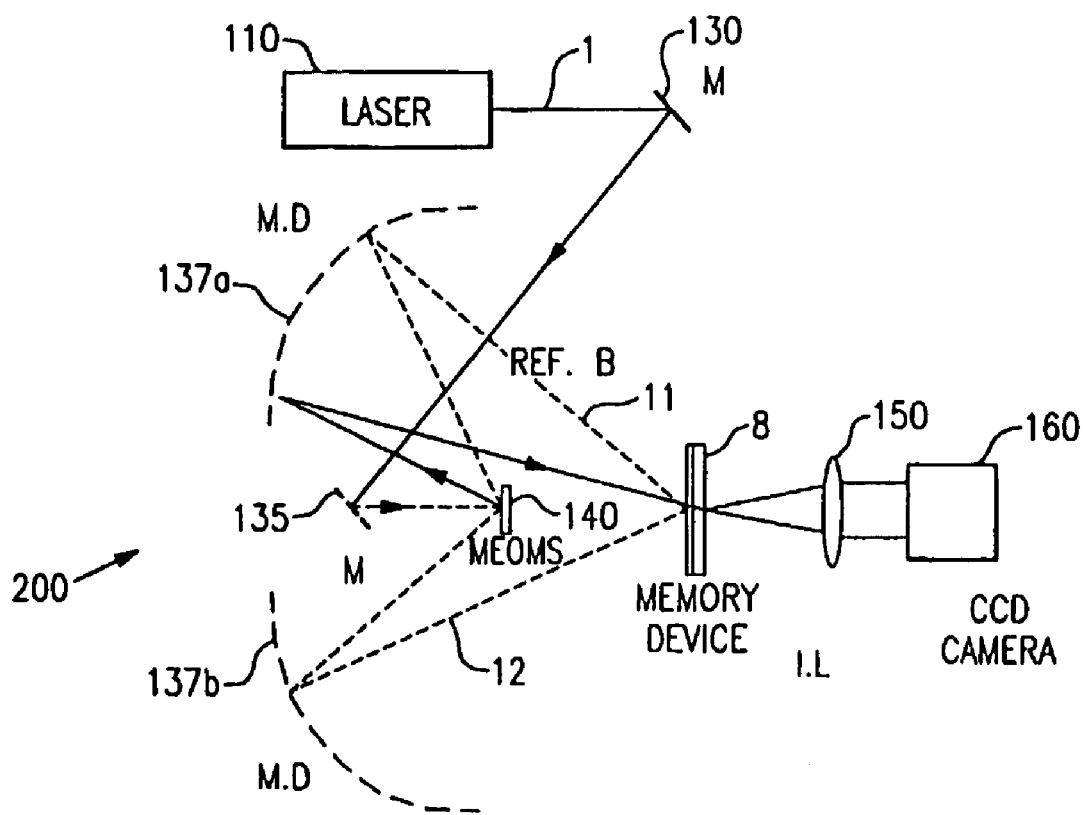
FIG. 4 shows an apparatus for reading information from a diffractive optics memory according to the present invention.

FIG. 4 shows an apparatus 200 for reading information from the diffractive optics memory 8 according to the present invention. A laser 110 emits a coherent light reference beam 1 which is directed by mirror 130 to a mirror 135. Mirror 135 then directs the coherent light beam to MEOMS (Micro Opto Electro Mechanical System) 140. The MEOMS 140 is configured to direct the reference beam 1 to any one of a plurality of micro-mirrors 137a, 137b which are distributed along a circular arc and the orientation of which will modify the angle of incidence of the reference beam 1. An optical axis is defined by the reference beam 1 being aligned perpendicular to a plane of the memory 8. The first plurality of mirrors 137a arranged around one side of the optical axis receives the reference beam 1 from the steering mirror 140 and one of these mirrors then directs the reference beam 1 at a first angle of a plurality of first angles towards one of the points of the memory 8. The second plurality of mirrors 137b arranged around the symmetrical side of the optical axis receives the reference beam 1 from the steering mirror 140 and one of these mirrors then directs the reference beam 1 at a second angle of a plurality of second angles towards the one of the points of the memory 8. The first angle is the same value as the second angle but formed on the symmetrical side of the optical axis.

A data packet is reconstructed by positioning the reference beam 1 at the same angle and spatial location in which the data packet was recorded. The portion of the reference beam 1 diffracted by the diffractive optics memory 8 forms the reconstruction, which is focused by imaging lens 150 to a detector array of CCD camera 160.

The principal of symmetrical angle reading is illustrated with the reference beams 11, 12. The MEOMS 140 is steered by a computer program (not shown) to form reference beam 11. The MEOMS 140 is then steered by the computer program to form the reference beam 12 at a symmetrical angle. The reference light beam 11 and reference light beam 12 intersect the optical axis at a point of the diffractive optics memory 8 at an identical angle value but on opposite sides of the optical axis. Thus two separate packets of information are sequentially reconstructed from the same point with symmetrical angles.

The present invention is not to be limited in scope by the specific embodiments described herein. Indeed, this application is intended to cover and modifications of the present invention, in addition to those described herein, and the present invention is not confined to the details which have been set forth. Thus, the scope of the invention should be determined by the appended claims and their legal equivalents, rather than by the examples given.

The invention claimed is:

1. A diffractive storage system for recording information on a diffractive optics memory, comprising:
    a coherent light source split to form an object beam and a corresponding reference beam, an optical axis being defined by said object beam being aligned perpendicular to a plane of said memory;
    a steering mirror configured to direct said reference beam received from said coherent light source;
    a first plurality of mirrors arranged around one side of said optical axis receiving said reference beam from said steering mirror and directing said reference beam at a first angle of a plurality of first angles towards said memory; and
    a second plurality of mirrors arranged around the symmetrical side of said optical axis receiving said reference beam from said steering mirror and directing said reference beam at a second angle of a plurality of second angles towards said memory, said first angle being identical in value to said second angle but formed on the symmetrical side of said optical axis.

2. The diffractive storage system of claim 1, wherein said memory comprises a polypeptide plate on which data is recorded.

3. The diffractive storage system of claim 1, wherein said steering mirror is a rotating mirror.

4. The diffractive storage system of claim 1, wherein said steering mirror is a Micro Opto Electro Mechanical System.

5. The diffractive storage system of claim 1, further comprising:
    said memory comprising a plurality of points storing information therein, said object beam and said reference beam interfering at said first angle to form a first sub-hologram at one of said points of said memory and said reference beam interfering with said object beam at said second angle to form a second sub-hologram at said point.

6. The diffractive storage system of claim 1, wherein said steering mirror is located on said optical axis directing said reference beam to one of said plurality of mirrors.

7. The diffractive storage system of claim 1, wherein said memory is made of a polypeptide material.

8. The diffractive storage system of claim 1, wherein said object beam has modulated thereon a plurality of pixels.

9. A diffractive storage method for recording information on a diffractive optics memory, comprising the steps of:
    forming an object beam and a reference beam coherent with said object beam, an optical axis being defined by said object beam being aligned perpendicular to a plane of said memory;
    directing said reference beam at a first angle of a first plurality of angles towards said memory by a first plurality of mirrors arranged around one side of said optical axis; and
    directing said reference beam at a second angle of a second plurality of angles towards said memory by a second plurality of mirrors arranged around the symmetrical side of said optical axis, said first angle being Identical to said second angle but formed on the symmetrical side of said optical axis.

10. The diffractive storage method of claim 9, further comprising:
    said memory wherein said object beam and said reference beam interfere at said first angle to form a first sub-hologram at said point of said memory and said reference beam interferes with said object beam at said second angle to form a second sub-hologram at said point.

11. The diffractive storage method of claim 9, further comprising a MEOMS which directs said reference beam to one of said plurality of mirrors.

12. The diffractive storage method of claim 9, wherein said memory is made of a polypeptide material.

13. The diffractive storage method of claim 9, wherein said object beam has modulated thereon a plurality of pixels.

14. A diffractive storage system for reading information from a diffractive optics memory having a plurality of points, comprising:
    a coherent light source forming a reference beam, an optical axis being defined by said reference beam being aligned perpendicular to a plane of said memory;
    a steering mirror configured to direct said reference beam received from said coherent light source to said memory;
    a first plurality of mirrors arranged around one side of said optical axis receiving said reference beam from said steering mirror and directing said reference beam at a first angle of a plurality of first angles towards one of said points of said memory; and
    a second plurality of mirrors arranged around the symmetrical side of said optical axis receiving said reference beam from said steering mirror and directing said reference beam at a second angle of a plurality of second angles towards said one of said points of said memory, said first angle being the same value as said second angle but formed on the symmetrical side of said optical axis.

15. The diffractive storage system of claim 14, wherein said steering mirror is a Micro Opto Electro Mechanical System.

16. The diffractive storage system of claim 14, wherein said steering mirror is located on said optical axis directing said reference beam to one of said plurality of mirrors.

17. The diffractive storage system of claim 14, wherein said memory is made of a polypeptide material.

18. The diffractive storage system of claim 14, further comprising:
    an array of light sensitive elements configured to detect a first reconstruction beam of a first packet of information at said point of said memory illuminated with said reference beam and to detect a second reconstruction beam of a second packet of information at said point of said memory illuminated with said reference beam.

19. A diffractive storage method for reading information from a diffractive optics memory, comprising the steps of:

directing a reference beam at a first angle of a first plurality of angles towards a first plurality of mirrors arranged around one side of an optical axis, said optical axis defined by said reference beam perpendicular to said memory;

reconstructing a first packet of information at a point of said memory with said reference beam;

directing said reference beam at a second angle of a second plurality of angles towards a second plurality of mirrors, said first angle being identical in value and symmetrical about said optical axis to said second angle; and reconstructing a second packet of information at said point of said memory with said reference beam.

20. The diffractive storage method of claim 19, wherein said memory is made of a polypeptide material.

* * * * *